(12) United States Patent
Kinoshita et al.

(10) Patent No.: US 6,486,717 B2
(45) Date of Patent: Nov. 26, 2002

(54) DIVIDER WITH CYCLE TIME CORRECTION

(75) Inventors: Toshiaki Kinoshita, Tokyo (JP); Kunio Aduma, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/640,723

(22) Filed: Aug. 18, 2000

(65) Prior Publication Data

US 2002/0063591 A1 May 30, 2002

(30) Foreign Application Priority Data

Aug. 20, 1999 (JP) ............................................ 11-233758

(51) Int. Cl.[7] .............................................. H03K 3/017
(52) U.S. Cl. ...................... 327/175; 327/165; 327/292; 377/28; 377/39
(58) Field of Search ................................ 327/175, 172, 327/173, 174, 176, 291, 292, 299, 165, 115, 117; 377/39, 28, 54, 47; 331/57, 40, 177 R; 375/371

(56) References Cited

U.S. PATENT DOCUMENTS 3,836,858 A * 9/1974 Kitano ....................... 327/115
4,566,111 A * 1/1986 Tanagawa ................... 327/273
5,365,183 A * 11/1994 Mitshuhira .................. 327/144
5,825,568 A * 10/1998 Lee ............................. 360/51
5,982,842 A * 11/1999 Ohtsuka et al. ............... 377/20
6,046,965 A * 4/2000 Oba ............................ 368/250

FOREIGN PATENT DOCUMENTS

JP 11-17528 1/1999

* cited by examiner

Primary Examiner—Tuan T. Lam
Assistant Examiner—Minh Nguyen
(74) Attorney, Agent, or Firm—Arent Fox Kintner Plotkin & Kahn, PLLC

(57) ABSTRACT

The oscillator 40 with cycle time correction includes a low accuracy oscillator 30A generating a clock CLK3, a counter 41 counting the clock CLK3 and cleared by activation of a clear signal CLR1, a register 42 storing a count CN of the counter 41 as a reference value RV in response to activation of a capture signal CAP; a comparator 43 activating a coincidence signal EQ when CN=RV, a control register 44 including a bit outputting a clear signal CLR2, a bit outputting an enable signal EN and a bit outputting a capture signal CAP, and logic circuits 45 and 46 activating the clear signal CLR1 when the clear signal CLR2 is active or when the enable signal EN and the coincidence signal EQ are both active.

6 Claims, 7 Drawing Sheets

DIVIDER WITH CYCLE TIME CORRECTION

BACKGROUND OF THE INVENTION

1. Field of the Invention

The present invention relates to a divider with cycle time correction for use as, for example, a timer or a clock signal generator.

2. Description of the Related Art

FIG. 5 shows a prior art circuit consists of a one-chip microcomputer 10 and external circuitry associated with an oscillator.

A CPU 11 in the computer 10 includes a high frequency clock input HCK to which a clock CLK1 is provided in a normal operating mode, a low frequency clock input LCK to which a clock CLK2 is provided in a low power consumption mode, and timer interrupt signal inputs INT1 and INT2 to which clocks CLK1A and CLK2A made by dividing frequencies of the clocks CLK1 and CLK2 through counters 12 and 22, respectively, are provided.

The clocks CLK1 and CLK2 are of, for example, 4 MHz and 32 kHz, respectively, and generated by oscillators 13 and 23, respectively.

In the oscillator 13, a resistor 15 is connected between one input and the output of an NAND gate 14, and a mode signal MOD0 from CPU 11 is provided to the other input of the NAND gate 14. An external crystal oscillator 16 is connected in parallel to the resistor 15, and external capacitors 17 and 18 are connected between respective ends of the crystal oscillator 16 and a ground line VSS. Constituents 24 to 28 of the oscillator 23 correspond to the constituents 14 to 18 of the oscillator 13. A mode signal MOD1 from CPU 11 is provided to one input of an NAND gate 24.

In the normal operating mode, the mode signals MOD0 and MOD1 are set high and low, respectively, and the clock CLK1 is in operation but the CLK2 is at rest. In the low power consumption mode, the mode signals MOD0 and MOD1 are set low and high, respectively, the clock CLK1 is at rest and the clock CLK2 is in operation. Although a timer (an oscillator) constructed of the counter 12 and the oscillator 13, and a timer constructed of the counter 22 and the oscillator 23 are both of high accuracy, the number of parts, in each timer, are large to cause a cost of the circuit to be high, and the timers cause the number of inputs of the one-chip microcomputer 10 to increase.

FIG. 6 shows another prior art circuit including a one-chip microcomputer 10A and external circuitry associated with an oscillator.

A CPU 11A is operable only in the normal operating mode, and a clock CLK2A generated by an oscillator 30 is provided to the interrupt signal input INT2 of the CPU 11A.

The oscillator 30 includes a Schmitt trigger circuit 31 and an NMOS transistor 32 in the computer 10A, and a resistor 33 and a capacitor 34 added externally to the computer 10A. The input and output of the Schmitt trigger circuit 31 are connected to the drain and gate of the NMOS transistor 32, respectively. The resistor 33 and the capacitor 34 are connected in series between a power supply line VDD and the ground line VSS to constitute a CR integrating circuit. The connection node between the resistor 33 and the capacitor 34 is connected to the input of the Schmitt trigger circuit 31.

An input signal SW1 to and an output signal CLK2A from the Schmitt trigger circuit 31 are as shown in FIG. 7. That is, when the potential of the saw tooth wave SW1 rises to V1, the output of the Schmitt trigger circuit 31 goes high to turn the NMOS transistor 32 on, and thereafter the potential of the saw tooth wave SW1 falls. When the potential of the saw tooth wave SW1 falls to V2, the output of the Schmitt trigger circuit 31 goes low to turn the NMOS transistor 32 off and thereafter, the potential of the SW1 again rises.

The CPU 11A accepts an interrupt request on the rising of the clock CLK2A and, for example, checks on states of a voltage of a battery for the computer 10A and a push button (not shown), and executes a processing depending on a result of the checks.

The oscillator 30 of FIG. 6 has parts in a smaller number than the oscillator constructed of the counter 22 and the oscillator 23 of FIG. 5, and costs lower and furthermore, the one-chip microcomputer 10A has a smaller number of inputs than that of FIG. 5.

However, since the time constant of the CR integrating circuit varies largely depending on products, the cycle time of the output clock CLK2A of the oscillator 30 disperses largely. In order to suppress this disperse, there arises a need to use the resistor 33 and the capacitor 34, both with high accuracy, thereby increasing a cost.

SUMMARY OF THE INVENTION

Accordingly, it is an object of the present invention to provide a divider with cycle time correction of high accuracy in spite of employing a low accuracy oscillator.

In one aspect of the present invention, there is provided a divider with cycle time correction comprising: a counter counting a clock and initialized by activation of a first initialization signal; a reference register storing a count of the counter in response to activation of a capture signal; and a comparator activating a coincidence signal to activate the first initialization signal when the count and an output value of the reference register is equal to each other.

With this aspect, even if a clock is generated by a low accuracy oscillator, a coincidence signal whose cycle time is of high accuracy can be obtained as a corrected clock.

Other aspects, objects, and the advantages of the present invention will become apparent from the following detailed description taken in connection with the accompanying drawings.

DESCRIPTION OF THE PREFERRED EMBODIMENTS

Figure 1:
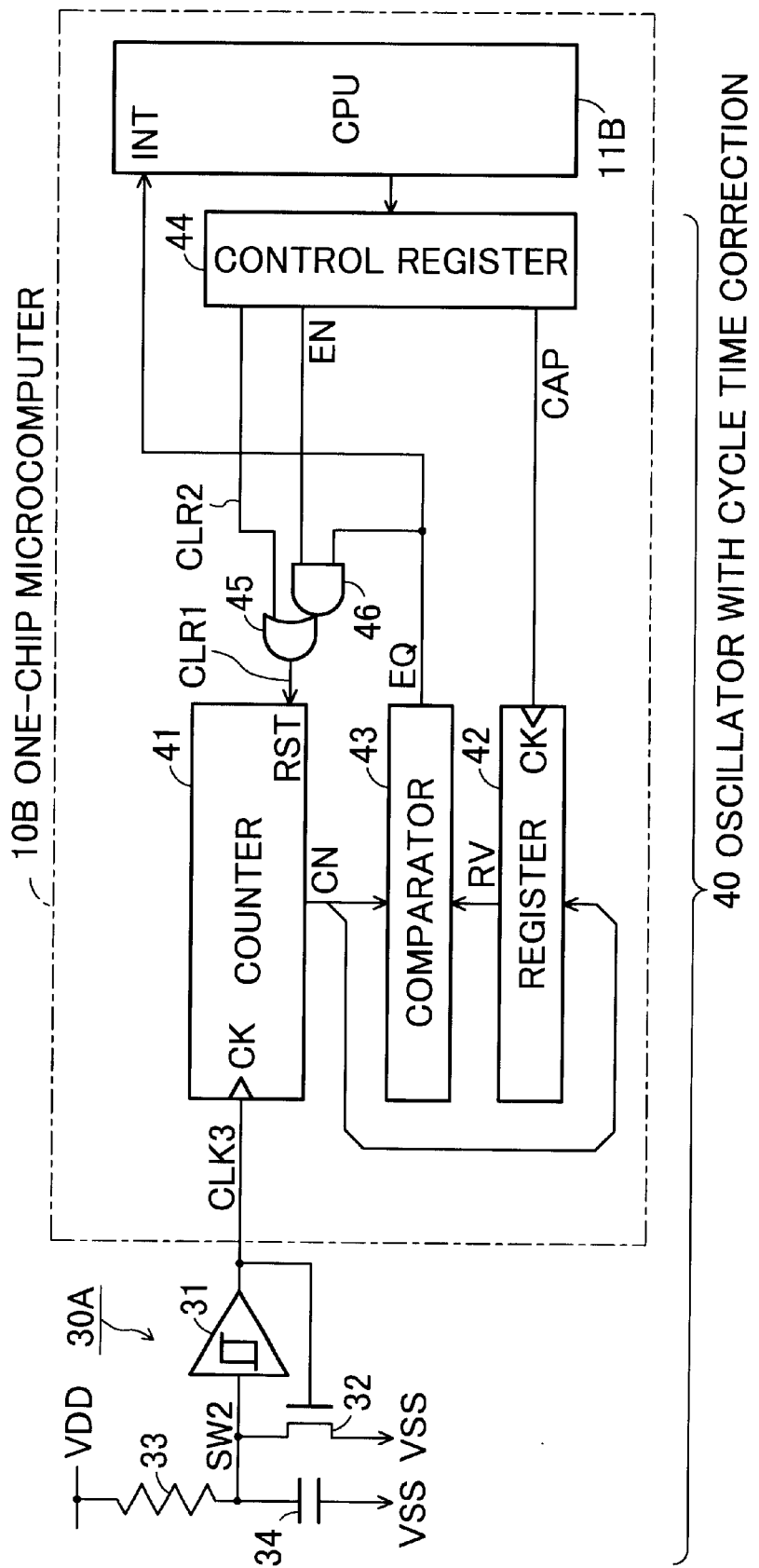
FIG. 1 is a block diagram showing a circuit including a one-chip microcomputer and external circuitry associated with an oscillator having cycle time correction, of the first embodiment according to the present invention.

Referring now to the drawings, wherein like reference characters designate like or corresponding parts throughout several views, preferred embodiments of the present invention are described below.

First Embodiment

FIG. 1 is a block diagram showing a circuit including a one-chip microcomputer 10B and external circuitry associated with an oscillator with cycle time correction, of the first embodiment according to the present invention.

The computer 10B includes a CPU 11B and a divider with cycle time correction, which is part of an oscillator 40 with cycle time correction. The oscillator 40 includes the part and a low accuracy oscillator 30A added externally to the computer 10B.

Figure 6:
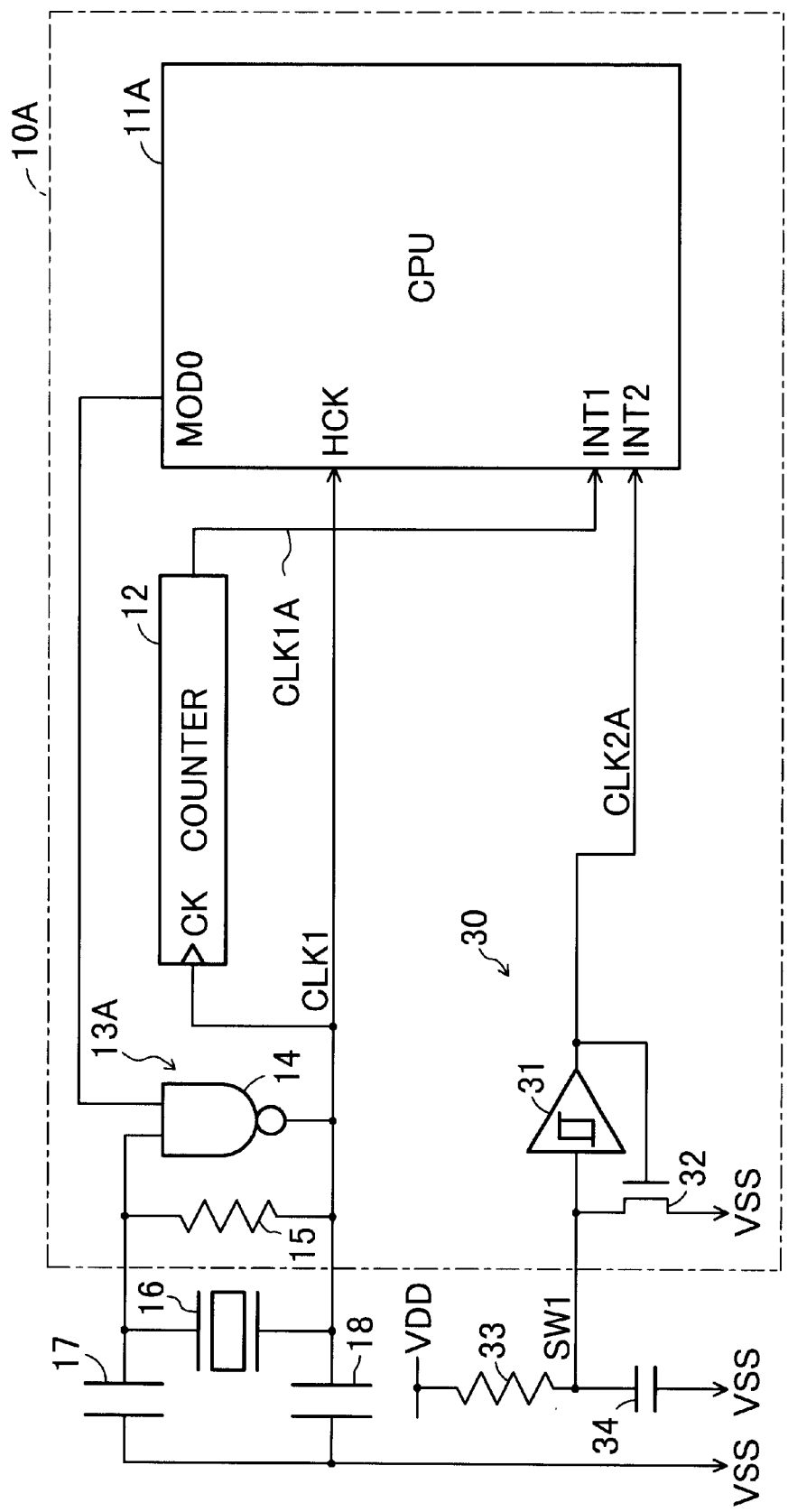
FIG. 6 is a block diagram showing another prior art circuit including a one-chip microcomputer and external circuitry associated with an oscillator.
Figure 7:
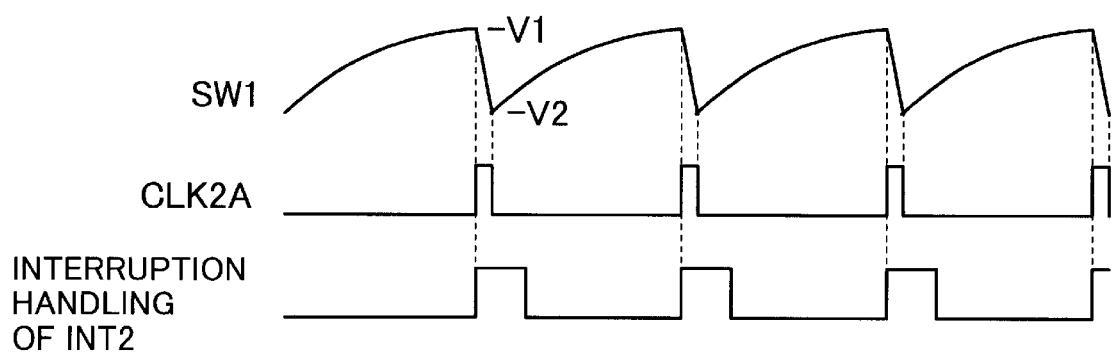
FIG. 7 is a time chart showing operation of the circuitry of FIG. 6.

With respect to circuit configuration, the oscillator 30A is same as the oscillator 30 of FIG. 6, but has different device constants therefrom. For example, the time constant of the CR integrating circuit of the oscillator 30 is 1.0 sec, while that of the oscillator 30A is 1 ms. The output clock CLK3 of a Schmitt trigger circuit 31 is provided to the clock input CK of a counter 41 in the computer 10B.

In the one-chip microcomputer 10B, the parallel data output of the counter 41 is connected to the data input of a register 42 and one data input of a comparator 43. The data output of the register 42 is connected to the other data input of the comparator 43.

The oscillator 40 with cycle time correction includes a control register 44, an OR gate 45 and a NAND gate 46, as control circuitry. The control register 44 contains bits outputting a clear signal CLR2, an enable signal EN and a capture signal CAP, and these bits are connected to one input of the OR gate 45, one input of the NAND gate 46 and the clock input CK of the register 42, respectively. The output of the comparator 43 is connected to the other input of the NAND gate 46, and provides a coincidence signal EQ. The output of the NAND gate 46 is connected to the other input of the OR gate 45, and the output of the OR gate 45 is connected to the reset signal input RST of the counter 41, to which a clear signal CLR1 is provided.

The CPU 11B sets the above three bits to the control register 44 and further, executes interruption handling in response to activation of the coincidence signal EQ provided to the interrupt signal input INT. Each of bit circuits of the clear signal CLR2 and capture signal CAP in the control register 44 may be a circuit outputting a pulse in response to an input of '1', or may be a simple flop-flip.

Next, description will be made of operation of the circuitry with configuration described above with reference to FIG. 2(A).

The CPU 11B causes the control register 44 to generate a pulse of the clear signal CLR2. This pulse passes through the OR gate 45 and is provided to the reset signal input RST of the counter 41 as the clear signal CLR1, thereby clearing the count CN of the counter 41 to zero.

After an elapse of executing given instructions from a time at which a pulse of the clear signal CLR2 is generated, the CPU 11B causes the control register 44 to generate a pulse of the capture signal CAP and at the same time, to raise the enable signal EN high. Thereby the count CN is stored in the register 42 as a reference value RV. The relation CN=RV is satisfied, and the coincidence signal EQ goes high, the clear signal CLR1 goes high as well, and the counter 41 is cleared to zero. Thereby, the coincidence signal EQ goes low and the clear signal CLR1 goes low, which enables the counter 41 to count again.

Pulses of the clear signal CLR2 and the capture signal CAP are required to be generated only once after power-on reset of the computer 10B.

When the count CN increases up to the reference value RV, the coincidence signal EQ again goes high. That is, a pulse of the coincidence signal EQ is generated each time when the time from the rising of the first clear signal CLR2 to the rising of the capture signal CAP elapses. This is because, even if the parts of the oscillator 30A have low accuracy, a proper value in the register 42 is automatically set depending on variations of cycle times of the clock CLK3 among products, and the cycle time of the coincidence signal EQ becomes substantially constant independently of accuracy of parts constituting the oscillator 30A. The accuracy is on the order of +/−0.75T, where T denotes a cycle time of the clock CLK3, and if RV is, for example, about 1000, then the accuracy is about +/−0.75 T/1000T=+/−0.075%.

Figure 2A:
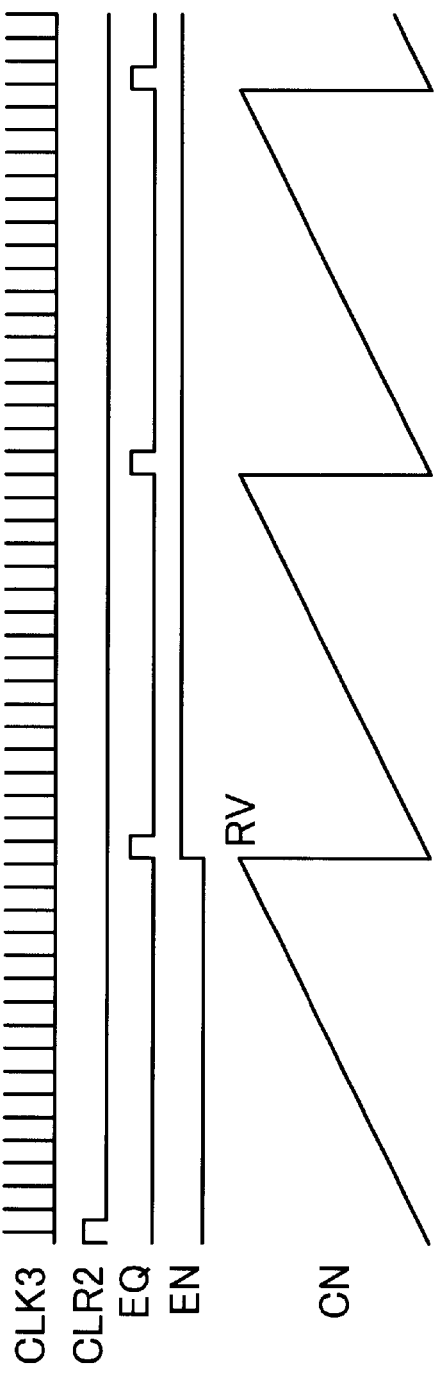
FIGS. 2(A) and 2(B) each are time charts showing operation of the oscillator with cycle time correction of FIG. 1.
Figure 2B:
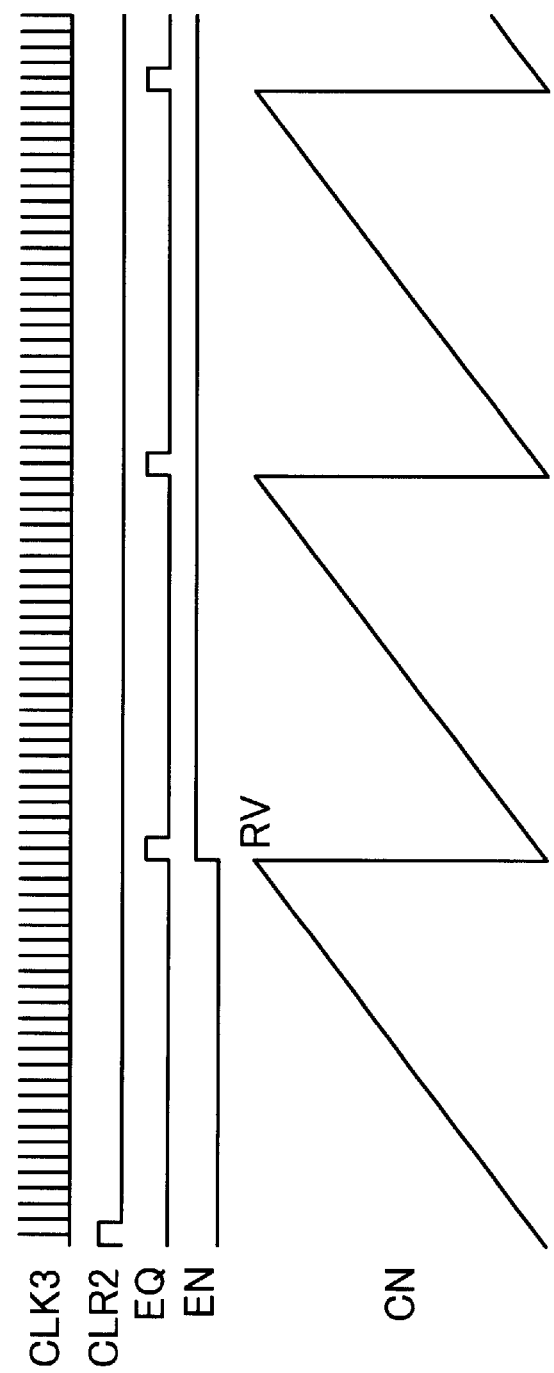

FIG. 2(B) shows in a case where a cycle time of the clock CLK3 is shorter than that of FIG. 2(A).

Figure 3:
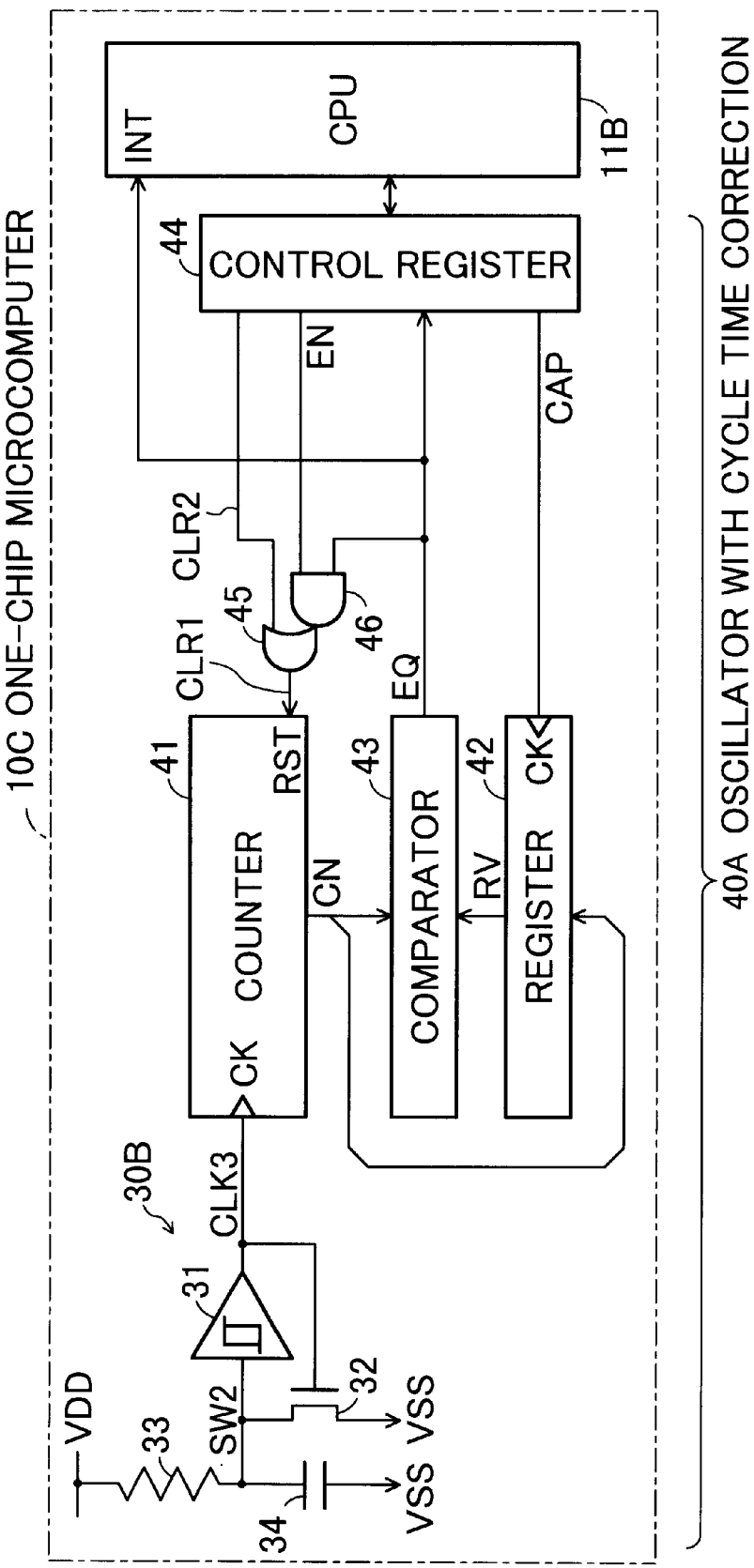
FIG. 3 is a modification made to the circuitry of FIG. 1.

FIG. 3 shows a modification made to the circuit of FIG. 1.

In this circuit, an oscillator 30B is included within a one-chip microcomputer 10C, therefore parts are fewer than in the case of FIG. 1 and the circuit can be constructed at a lower cost. The reason why the oscillator 30B can be included is that the time constant of the integrating circuit constructed of the resistor 33 and the capacitor 34 is sufficiently small compared to that of FIG. 6.

Second Embodiment

Figure 4:
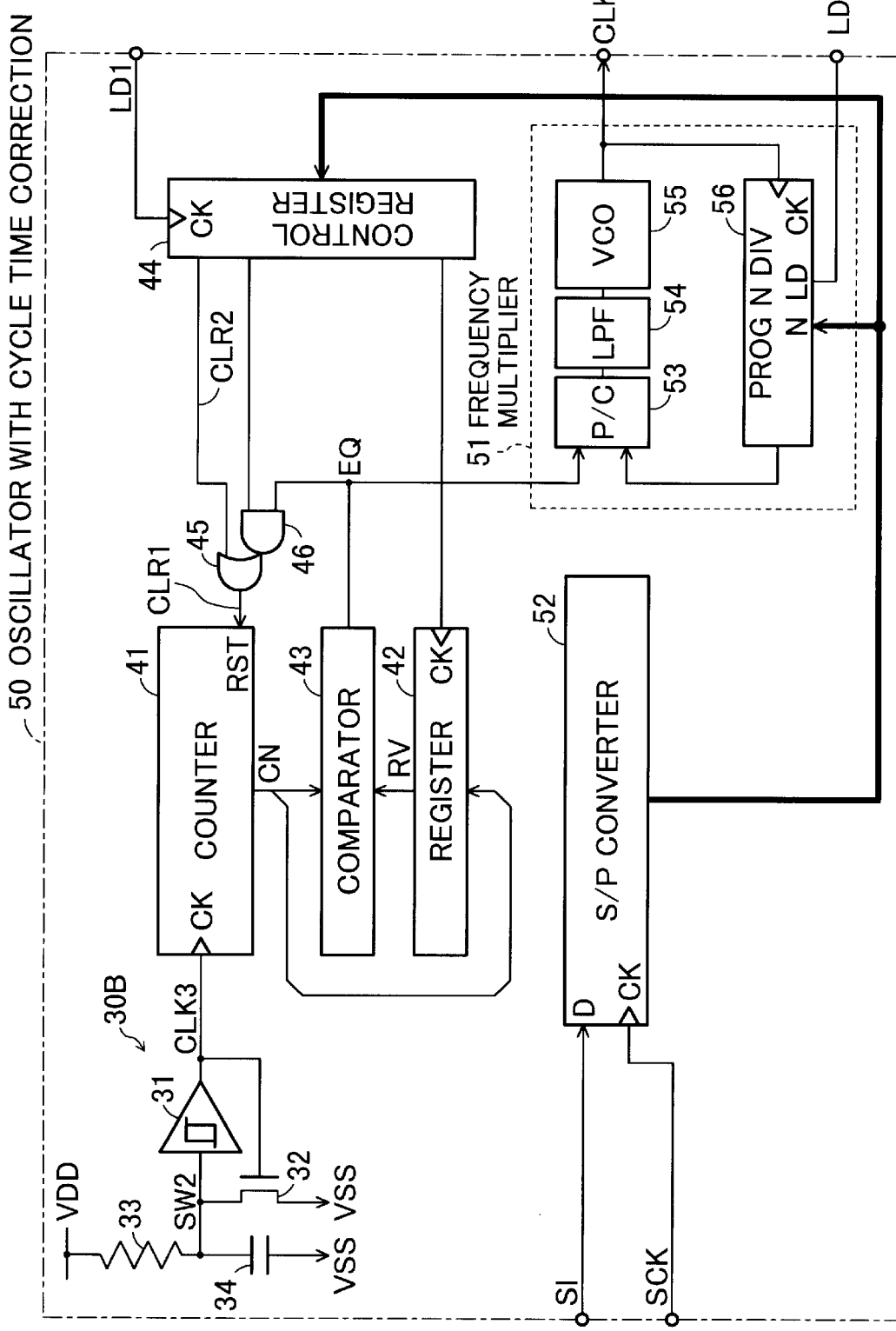
FIG. 4 is a block diagram showing an oscillator with cycle time correction of the second embodiment according to the present invention.
Figure 5:
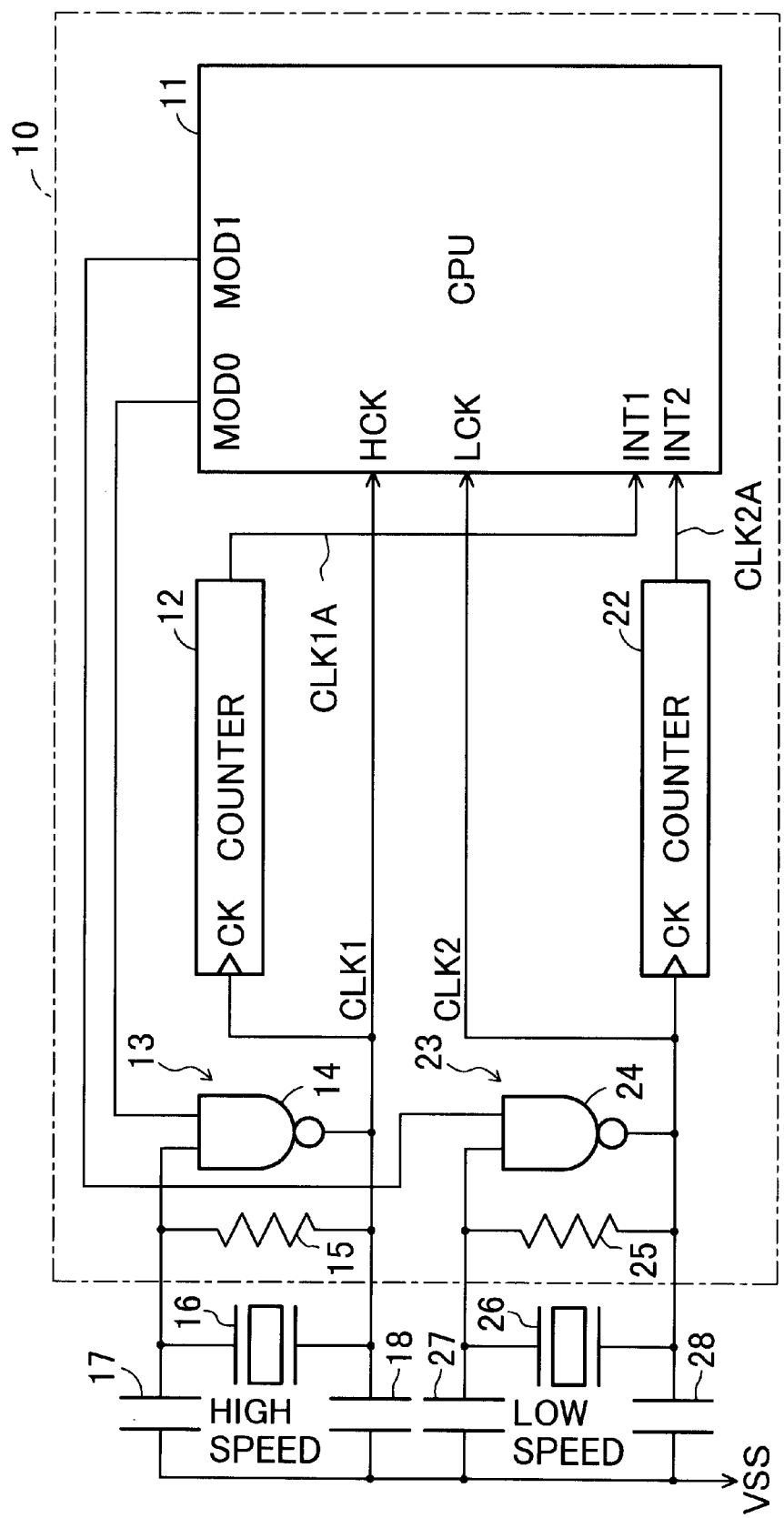
FIG. 5 is a block diagram showing a prior art circuit including a one-chip microcomputer and external circuitry associated with an oscillator.

FIG. 4 shows an oscillator 50 with cycle time correction of the second embodiment according to the present invention.

This circuit 50 includes the oscillator 40A with cycle time correction of FIG. 3 and in addition to this, a frequency multiplier 51 and a series/parallel converter 52.

The frequency multiplier 51 generates a system clock CLK having a frequency which is N times higher than that of the coincidence signal EQ as a reference clock. The system clock CLK is used as an operating clock for devices operating in synchronization with the clock, for example, a CPU and peripheral devices thereof. The frequency multiplier 51 is a PLL circuit constructed of a phase comparator 53, a low pass filter 54, a voltage controlled oscillator 55 and a programmable N divider (a programmable divide-by-N counter) 56, which are connected in a loop. The phase comparator 53 compares the coincidence signal EQ with the output signal of the divider 56 in phase.

The series/parallel converter 52 is employed to lessen the number of inputs of the oscillator 50 with cycle time correction, and serial data SI and a shift clock SCK are provided from external to the serial data input D and the shift clock input CK, respectively, of the oscillator 50 with cycle time correction. The parallel data output of the series/parallel converter 52 is connected to the data input for setting N of the programmable N divider 53 and the data input of the control register 44. Load signals LD1 and LD2 are provided from external to the clock input CK of the control register 44 and the load signal input LD of the divider 56, respectively.

Next, description will be made of operation of the second embodiment with the configuration described above.

In order to set a value N for the programmable N divider 56, the serial data SI is provided to the series/parallel converter 52 in synchronization with the shift clock SCK and next, the contents of the series/parallel converter 52 are set as the value N to the programmable N divider 56 at a timing of a pulse of the load signal LD2.

Then, in order to set the data described in the above-described first embodiment to the control register 44, the data is set in the series/parallel converter 52 and after this, the data is set in the control register 44 at a timing of a pulse of the load signal LD1.

According to the second embodiment, it is possible to construct not only an oscillator with cycle time correction for a timer that achieve high accuracy with a fewer parts but also a system clock generator.

Although preferred embodiments of the present invention has been described, it is to be understood that the invention is not limited thereto and that various changes and modifications may be made without departing from the spirit and scope of the invention.

For example, the counter 41 may be a down counter, or the initialization thereof may be a value other than zero.

The coincidence signal EQ may be provided directly to the OR gate 45 without using the enable signal EN and the AND gate 46 so as to oscillate all the time.

What is claimed is:

1. A divider with cycle time correction comprising:
   a counter counting a clock and initialized by activation of a first initialization signal;
   a reference register connected to said counter to store a count of said counter in response to activation of a capture signal;
   a comparator activating a coincidence signal when said count and an output value of said reference register are equal to each other; and
   a control circuit activating said first initialization signal in response to activation of a second initialization signal or activation of both an enable signal and said coincidence signal, said control circuit activating said capture signal after a predetermined time has elapsed from activation of said second initialization signal.

2. The divider with cycle time correction of claim 1, wherein said control circuit comprises:
   a control register having a bit outputting said second initialization signal, a bit outputting said enable signal, and a bit outputting said capture signal; and
   a logic circuit activating said first initialization signal when said second initialization signal is active or when said enable signal and said coincidence signal are both active.

3. The divider with cycle time correction of claim 2, further comprising:
   a PLL circuit receiving said coincidence signal for generating a clock with a frequency an integral times a frequency of said coincidence signal as a reference clock.

4. An oscillator with cycle time correction, comprising:
   an oscillator generating a clock;
   a counter counting said clock and initialized by activation of a first initialization signal;
   a reference register connected to said counter to store a count of said counter in response to activation of a capture signal;
   a comparator activating a coincidence signal when said count and an output value of said reference register is equal to each other; and
   a control circuit activating said first initialization signal in response to activation of a second initialization signal or activation of both an enable signal and said coincidence signal, said control circuit activating said capture signal after a predetermined time has elapsed from activation of said second initialization signal.

5. The oscillator with cycle time correction of claim 4, wherein said control circuit comprises:
   a control register having a bit outputting said second initialization signal, a bit outputting said enable signal, and a bit outputting said capture signal; and
   a logic circuit activating said first initialization signal when said second initialization signal is active or when said enable signal and said coincidence signal are both active.

6. The oscillator with cycle time correction of claim 5, further comprising:
   a PLL circuit receiving said coincidence signal for generating a clock with a frequency an integral times a frequency of said coincidence signal as a reference clock.

* * * * *